US011277105B2

(12) United States Patent
Lin et al.

(10) Patent No.: US 11,277,105 B2
(45) Date of Patent: Mar. 15, 2022

(54) AUDIO DEVICE, ELECTRONIC DEVICE HAVING AUDIO DEVICE AND AUDIO SIGNAL PROCESSING METHOD

(71) Applicant: REALTEK SEMICONDUCTOR CORP., Hsinchu (TW)

(72) Inventors: Shih-Hsin Lin, Hsinchu (TW); Che-Hung Lin, Hsinchu (TW); Yi-Chang Tu, Hsinchu (TW)

(73) Assignee: REALTEK SEMICONDUCTOR CORP., Hsinchu (TW)

( * ) Notice: Subject to any disclaimer, the term of this patent is extended or adjusted under 35 U.S.C. 154(b) by 63 days.

(21) Appl. No.: 17/009,367

(22) Filed: Sep. 1, 2020

(65) Prior Publication Data

US 2021/0067106 A1 Mar. 4, 2021

(30) Foreign Application Priority Data

Sep. 2, 2019 (TW) .................................. 108131576

(51) Int. Cl.
*H03F 3/183* (2006.01)
*H04R 3/00* (2006.01)
*H04R 29/00* (2006.01)

(52) U.S. Cl.
CPC .............. *H03F 3/183* (2013.01); *H04R 3/00* (2013.01); *H04R 29/001* (2013.01); *H03F 2200/03* (2013.01); *H03F 2200/375* (2013.01)

(58) Field of Classification Search
CPC ........... H03F 2200/03; H03F 2200/375; H03F 3/183; H04R 3/00; H04R 29/001
See application file for complete search history.

(56) References Cited

U.S. PATENT DOCUMENTS

| 8,525,710 | B1* | 9/2013 | Tsang | .................. | H03F 3/45968 |
| | | | | | 341/118 |
| 8,824,703 | B2* | 9/2014 | Lesso | ...................... | H03F 1/305 |
| | | | | | 381/121 |
| 9,020,165 | B2 | 4/2015 | Viegas | | |
| 9,287,839 | B1* | 3/2016 | Amadi | ................ | H03F 3/45475 |
| 2005/0151585 | A1* | 7/2005 | Honda | .................. | H03F 3/2171 |
| | | | | | 330/10 |

(Continued)

FOREIGN PATENT DOCUMENTS

WO   WO 2019/016280 A1   1/2019

*Primary Examiner* — David L Ton
(74) *Attorney, Agent, or Firm* — Birch, Stewart, Kolasch & Birch, LLP

(57) ABSTRACT

An audio device is adapted to receive and process a digital audio signal and output an analog audio signal. The audio device includes an adder, a digital-to-analog conversion circuit, an amplifying circuit, a voltage detecting circuit and an offset compensating circuit. The voltage detecting circuit detects a supply voltage received by the amplifying circuit. The offset compensating circuit generates a DC offset compensation value according to the supply voltage. The adder adds the digital audio signal and the DC offset compensation value to output an added signal. The digital-to-analog conversion circuit converts the added signal into a converted analog audio signal. The amplifying circuit amplifies the converted analog signal to output an amplified analog signal. Accordingly, the audio device can reduce pop noise caused by a DC offset.

14 Claims, 5 Drawing Sheets

(56) References Cited

U.S. PATENT DOCUMENTS

| | | | |
|---|---|---|---|
| 2006/0186955 A1* | 8/2006 | Quilter | H03F 3/217 330/10 |
| 2007/0124620 A1* | 5/2007 | Miyazaki | H04R 19/02 713/323 |
| 2007/0139103 A1* | 6/2007 | Roeckner | H03F 3/2173 330/10 |
| 2011/0102082 A1* | 5/2011 | Rafeeque | H03F 1/52 330/253 |
| 2012/0154032 A1* | 6/2012 | Lesso | H03F 3/183 330/109 |
| 2012/0206173 A1* | 8/2012 | Wimpenny | H03F 3/265 327/109 |
| 2014/0340147 A1* | 11/2014 | Schuurmans | H03G 3/301 330/254 |
| 2020/0186927 A1* | 6/2020 | Lesso | H03G 3/3005 |

* cited by examiner

AUDIO DEVICE, ELECTRONIC DEVICE HAVING AUDIO DEVICE AND AUDIO SIGNAL PROCESSING METHOD

CROSS-REFERENCE TO RELATED APPLICATION

This non-provisional application claims priority under 35 U.S.C. § 119(a) to Patent Application No. 108131576 in Taiwan, R.O.C. on Sep. 2, 2019, the entire contents of which are hereby incorporated by reference.

BACKGROUND

Technical Field

The present disclosure relates to an audio device configured to reduce pop noise.

Related Art

With technology advancing, electronic devices are becoming increasingly adopted in our daily lives. Many electronic devices are provided with an audio device or even a sound output device for outputting audio.

However, when the electronic device is turned on or off, the sound output device often output noise due to the influence of noise in audio signal. When the audio device is turned on or off, or when a plug is inserted into or removed from an input or port of the audio device, the sound output device may also make similar noise. The reasons for the noise made by the sound output device are usually a DC offset of the audio device and the sudden change of the voltage of the output end of an audio amplifier for driving the sound output device. The frequency of the voltage change caused by the DC offset is generally within the human hearing range, so the sound output device will output annoying noise which is generally called pop noise.

SUMMARY

Based on the above, the present disclosure provides an audio device and an audio signal processing method thereof.

According to some embodiments, the audio device includes an adder, a digital-to-analog conversion circuit, an amplifying circuit, a voltage detecting circuit and an offset compensation circuit. The adder includes a first input terminal, a second input terminal and an output terminal. The adder is configured to add signals of the first input terminal and the second input terminal to output an added signal through the output terminal. The first input terminal is configured to receive a digital audio signal. The digital-to-analog conversion circuit is configured to perform digital-to-analog conversion on the added signal to generate a converted analog audio signal. The amplifying circuit is configured to amplify the converted analog audio signal to generate an amplified analog audio signal. The voltage detecting circuit is configured to detect a supply voltage received by the amplifying circuit and output a voltage signal X. The offset compensation circuit is configured to obtain a DC offset compensation value Y according to the voltage signal X and output the DC offset compensation value Y to the second input terminal.

In some embodiments, the offset compensation circuit includes a linear operation circuit. The linear operation circuit obtains the DC offset compensation value according to a linear equation, the voltage signal, a slope parameter and a constant, wherein the linear equation is:

$$Y = M*X + C,$$

wherein Y is the DC offset compensation value, X is the voltage signal, M is the slope parameter, and C is the constant.

In some embodiments, the offset compensation circuit further includes a storage device configured to store the slope parameter and the constant and output the slope parameter and the constant to the linear operation circuit.

In some embodiments, the audio device further includes a first switch and a second switch, wherein when the first switch is activated, the first switch connects the digital audio signal to the first input terminal, and when the second switch is activated, the amplified analog audio signal is output.

In some embodiments, an electronic device is equipped with an audio device. The electronic device includes an audio generating circuit, a power supply circuit, an audio device and a control circuit. The audio generating circuit is configured to generate a digital audio signal. The power supply circuit is configured to generate power. The audio device includes an audio output end, an adder, a digital-to-analog conversion circuit, an amplifying circuit, a voltage detecting circuit and an offset compensation circuit. The adder may be a digital adder circuit. The adder includes a first input terminal, a second input terminal and an output terminal. The adder is configured to add signals of the first input terminal and the second input terminal to output an added signal through the output terminal. The first input terminal is configured to receive a digital audio signal. The digital-to-analog conversion circuit is configured to perform digital-to-analog conversion on the added signal to generate a converted analog audio signal. The amplifying circuit is configured to amplify the converted analog audio signal to generate an amplified analog audio signal. The voltage detecting circuit is configured to detect a supply voltage received by the amplifying circuit and output a voltage signal. The offset compensation circuit is configured to obtain a DC offset compensation value according to the voltage signal and output the DC offset compensation value to the second input terminal. The control circuit is configured to activate the power supply circuit to supply the generated power to the audio device when the audio input end is connected to an audio connector.

In some embodiments, the audio device further includes a first switch and a second switch. After the audio input end is connected to the audio connector for a predetermined time, the control circuit activates the first switch to connect the digital audio signal to the first input terminal, and activates the second switch to output the amplified analog audio signal through the audio output end.

In some embodiments, an audio signal processing method comprises starting a voltage detecting circuit, detecting a supply voltage which an amplifying circuit is supplied with, obtaining a DC offset compensation value according to the supply voltage, and compensating the DC offset compensation value.

In conclusion, according to some embodiments, the audio device, the electronic device and the audio signal processing method can appropriately compensate a DC bias of the audio device according to the change of the supply voltage received by the amplifying circuit, thereby preventing the audio device from generating pop noise.

DETAILED DESCRIPTION

Figure 1:
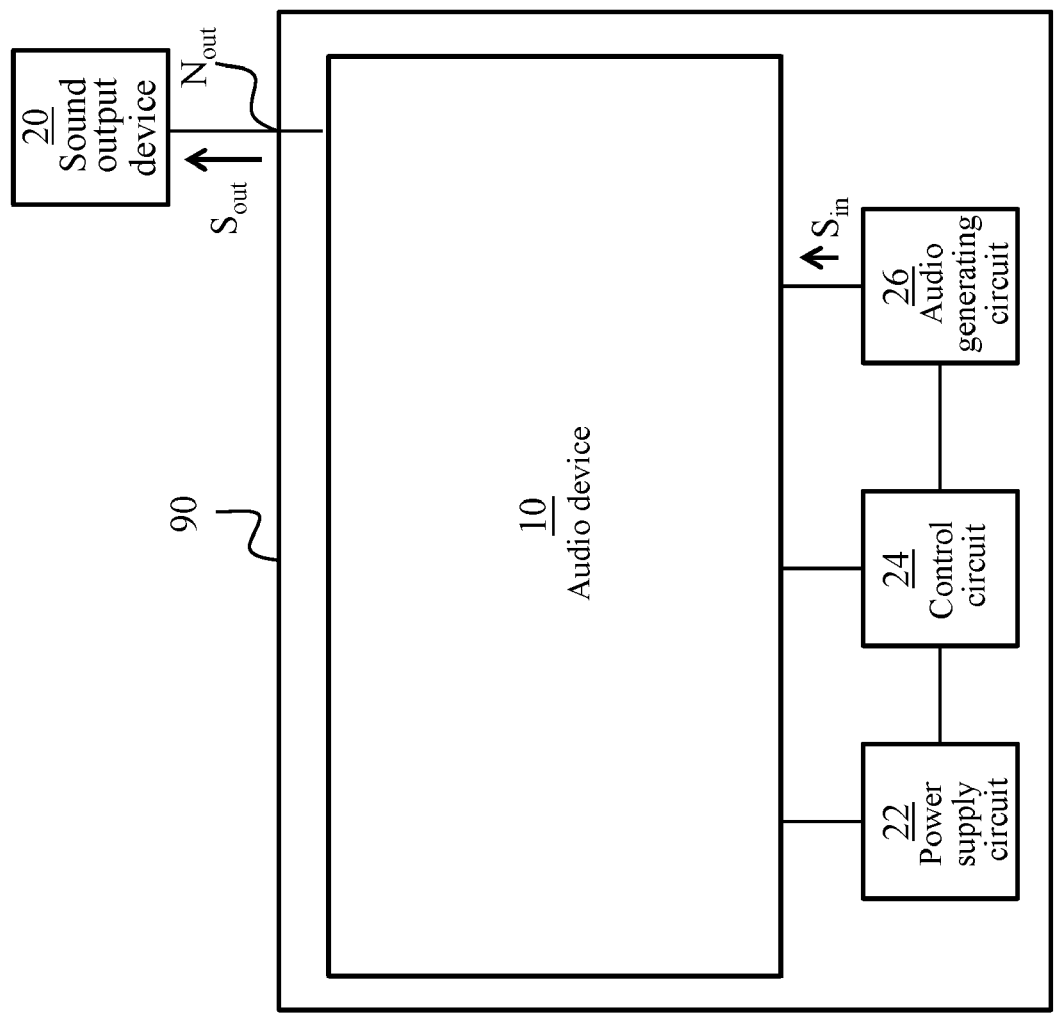
FIG. 1 illustrates a block diagram of an audio device applied to an electronic device according to some embodiments of the present invention.

Referring to FIG. 1, FIG. 1 illustrates a block diagram of an audio device 10 applied to an electronic device 90 according to some embodiments of the present invention. The electronic device 90 is an electronic device provided with the audio device 10. The electronic device is but not limited to, a mobile device, a computer, a mobile phone, a tablet computer, a music player, and the like. In some embodiments, the audio device 10 is, but not limited to, a driver or a driving circuit adapted to drive an earphone, a loudspeaker, a sound box or other sound output devices 20 to play audio signals.

In some embodiments, a control circuit 24 is configured to detect whether an audio connector (or called as plug) of the sound output device 20 is connected to an audio output end $N_{out}$ (or called an audio port) of the audio device 10. When the audio connector of the sound output device 20 is connected to the audio output end $N_{out}$ of the audio device 10, the control circuit 24 activates the audio device 10. The activation herein may be, but not limited to, supplying power to the audio device 10. FIG. 1 illustrates a power supply circuit 22 supplying power to the audio device 10. When the audio device 10 is activated (powered), internal components of the audio device 10 begin to operate. The audio device 10 receives an audio source signal $S_{in}$ from an audio generating circuit 26 during operation, and the audio device 10 performs digital-to-analog conversion and amplification on the audio source signal $S_{in}$ to output an audio source signal $S_{out}$ to the sound output device 20. For convenience of explanation, the audio source signal $S_{in}$ received by the audio device 10 (that is, the audio source signal from the audio generating circuit 26) is called a digital audio signal $S_{in}$, and the output audio source signal $S_{out}$ is called an analog audio signal $S_{out}$ (or amplified analog audio signal).

In some embodiments, the above-mentioned "detecting whether the audio connector of the sound output device 20 is connected to the audio output end $N_{out}$ of the audio device 10 by the control circuit 24" is as follows: the control circuit 24 detects whether a voltage level of a specific contact of the audio output end $N_{out}$ reaches a predetermined value. The predetermined value may be zero (i.e. grounded) or a high level. When the control circuit 24 detects the voltage level of the specific contact reaches the predetermined value, the control circuit 24 determines that the audio connector is connected to the audio output end $N_{out}$ (that is, the connection state is "connected").

In some embodiments, the audio generating circuit 26 includes a memory for storing music data and a circuit for reading the stored music data and converting the stored music data into an audio signal.

When in operation, the audio device 10 is adapted to compensate a DC offset between the digital audio signal $S_{in}$ and the amplified analog audio signal $S_{out}$. Therefore, when the audio device 10 is driven to operate and the audio device 10 outputs the audio source signal $S_{out}$ to the sound output device 20, the sound output device 20 would not make the pop noise due to the DC offset or have the pop noise mitigated.

Figure 2:
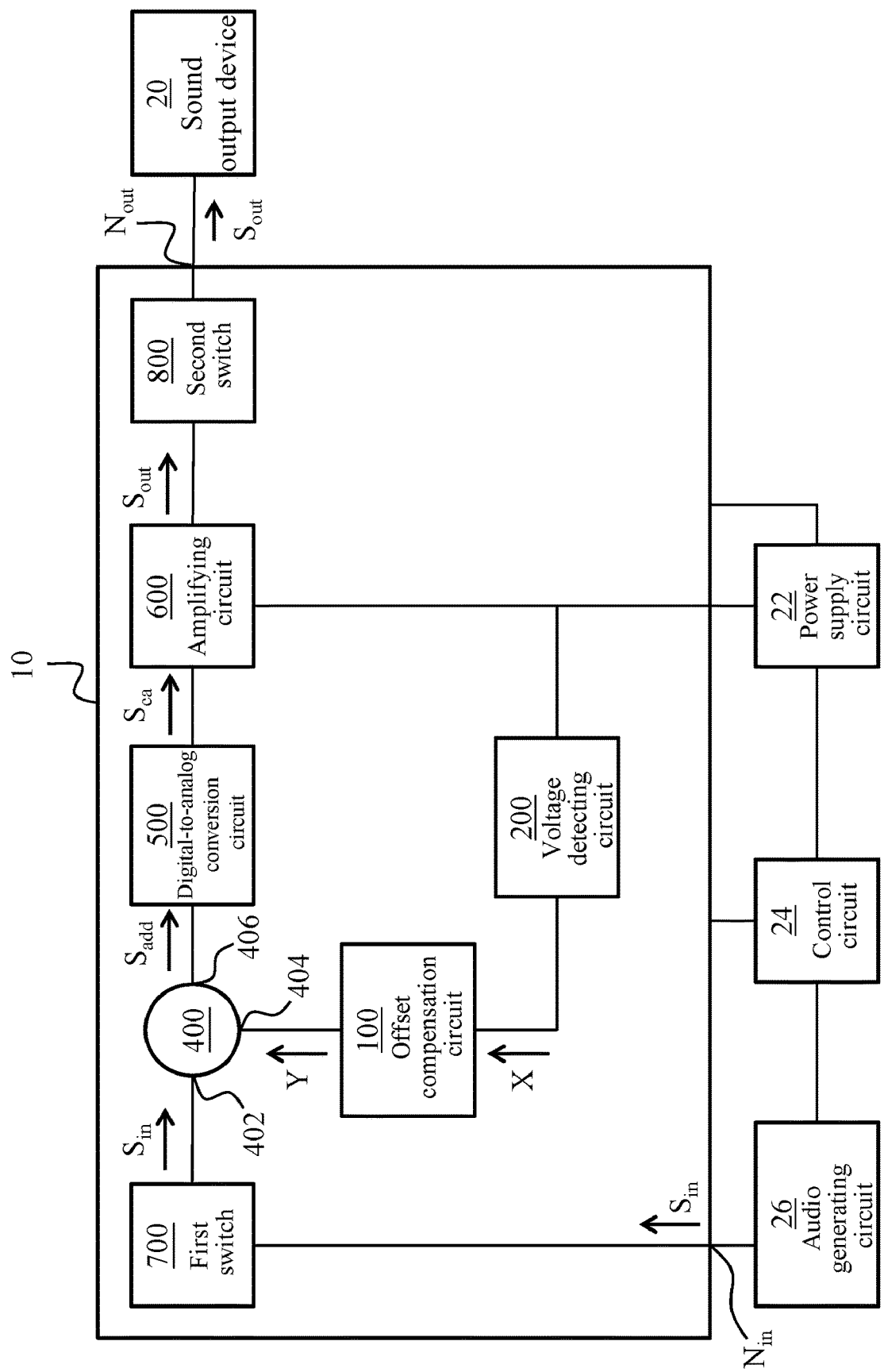
FIG. 2 illustrates a block diagram of an audio device according to some embodiments of the present invention.

Referring to FIG. 2, FIG. 2 illustrates a block diagram of an audio device according to some embodiments of the present invention. The audio device 10 includes an adder 400, a digital-to-analog conversion circuit 500, an amplifying circuit 600, a voltage detecting circuit 200 and an offset compensation circuit 100. The adder 400 includes a first input terminal 402, a second input terminal 404 and an output terminal 406. The adder 400 is configured to add signals of the first input terminal 402 and the second input terminal 404, and output an added signal $S_{add}$ at the output terminal 406. The first input terminal 402 is configured to receive the digital audio signal $S_{in}$. The digital-to-analog conversion circuit 500 is configured to perform digital-to-analog conversion on the added signal $S_{add}$ to generate a converted analog audio signal $S_{ca}$. The amplifying circuit 600 is configured to amplify the converted analog audio signal $S_{ca}$ to generate the amplified analog audio signal $S_{out}$. The voltage detecting circuit 200 is configured to detect a supply voltage which the amplifying circuit 600 is supplied with and output a voltage signal X related to the supply voltage. The offset compensation circuit 100 is configured to obtain a DC offset compensation value Y according to the voltage signal X and output the DC offset compensation value Y to the second input terminal 404.

Based on the above, the adder 400 is configured to add the DC offset compensation value Y and the digital audio signal $S_{in}$ in order to output the added signal $S_{add}$. Therefore, the audio device 10 compensates the input digital audio signal $S_{in}$ by the DC offset compensation value Y so as to substantially eliminate the DC offset during operation of the audio device 10. The amplifying circuit 600 couples the amplified analog audio signal $S_{out}$ to the audio output end $N_{out}$ to serve as the output of the audio device 10.

Specifically, the connection relation among all components of the audio device 10 is as follows: the input end of the adder 400 is coupled to an audio input end $N_{in}$ and the offset compensation circuit 100. The output terminal 406 of the adder 400 is coupled to the digital-to-analog conversion circuit 500. The offset compensation circuit 100 is coupled to the voltage detecting circuit 200. The digital-to-analog conversion circuit 500 is coupled to the amplifying circuit 600. The amplifying circuit 600 is coupled to the audio output end $N_{out}$.

Figure 4:
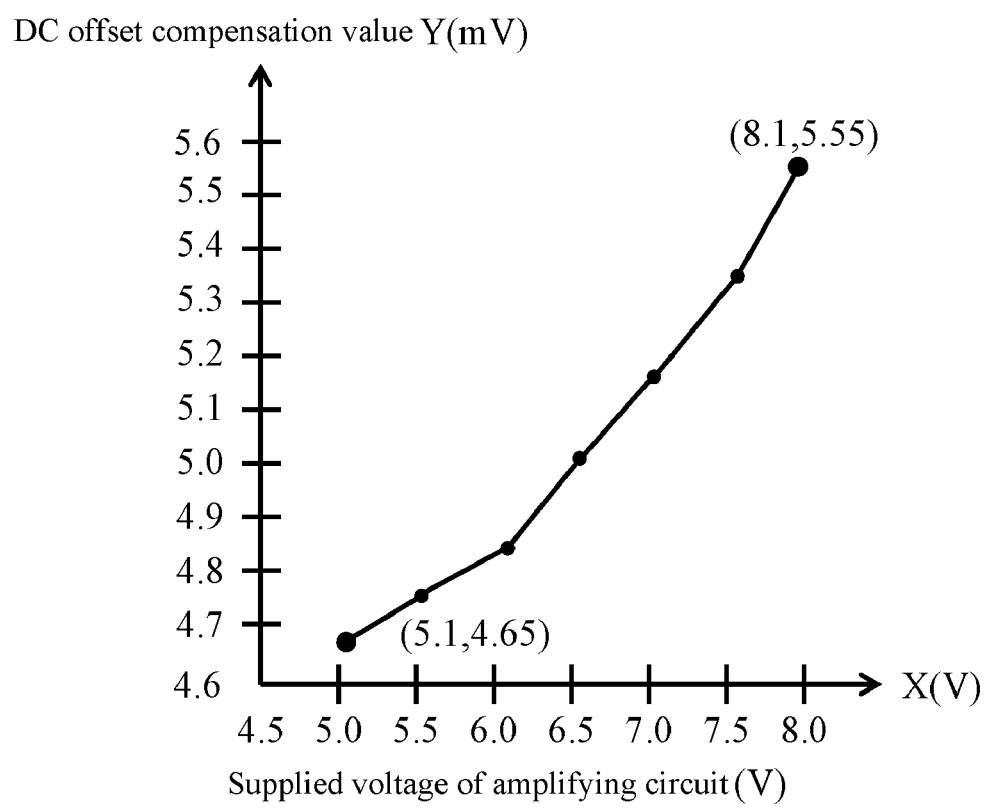
FIG. 4 illustrates a graph of relationship between a voltage signals and a DC offset compensation values according to some embodiments of the present invention.

FIG. 2 illustrates the power supply circuit 22 supplying power to the audio device 10 and the amplifying circuit 600. In some embodiments, the power of the amplifying circuit 600 is supplied by other power supply devices. For example, the audio device 10 includes a power supply device internally, and the power of the amplifying circuit 600 is supplied by the power supply device. The voltage detecting circuit 200 is configured to detect a supply voltage of the supplied power of the amplifying circuit 600 and generate a voltage signal X. The supplied power of the amplifying circuit 600 is the power which the amplifying circuit 600 is supplied with. Subsequently, the offset compensation circuit 100 generates the DC offset compensation value Y according to the voltage signal X. The voltage signal X is related to the supply voltage. When the supply voltage received by the amplifying circuit 600 changes, the DC offset of the audio device 10 also changes. How the offset compensation circuit 100 obtains the DC offset compensation value Y according to the voltage signal X can be found with reference to FIG. 4. FIG. 4 is a graph of relationship between a voltage signals X and a DC offset compensation values Y according to some embodiments of the present invention. According to the inventor's research, the voltage signal X and the DC offset compensation value Y substantially have a linear relation. Therefore, in some embodiments, the relation between the voltage signals X and the DC offset compensation values Y is expressed as the following linear equation:

$Y=M*X+C,$

Wherein Y is the DC offset compensation value, X is the voltage signal, M is the slope parameter, and C is the constant. In some embodiments, how to obtain the relationship of voltage signals and DC offset compensation values in FIG. 4 is as follows (please referring to FIG. 2 as well). Firstly, the control circuit 24 controls the power supply circuit 22 to supply power to the audio device 10, controls the power supply circuit 22 to supply power to the amplifying circuit 600 at a preset voltage value (such as 8.1V), and controls the audio generating circuit 26 not to output any digital audio signal $S_{in}$, and at this moment, the voltage signal obtained by the voltage detecting circuit 200 is 8.1V. After a preset time (detailed later), the control circuit 24 detects the amplified analog audio signal $S_{out}$ and adjusts the DC offset compensation value output by the offset compensation circuit 100 until the amplified analog audio signal $S_{out}$ has no DC offset. And at this moment, the control circuit 24 records the voltage signal X and the DC offset compensation value Y (8.1, 5.55). By analogy, the control circuit 24 can obtain the coordinates of multiple voltage signals X and DC offset compensation values Y as shown in FIG. 4. Then, the control circuit 24 calculates and obtains the slope parameter M and the constant C according to the obtained coordinates of the voltage signals X and the DC offset compensation values Y. In other embodiments, the control circuit 24 can calculate and obtain the slope parameter M and the constant C according to as little as 2 sets of obtained coordinates of voltage signals X and DC offset compensation values Y.

The control circuit 24 can detect the amplified analog audio signal $S_{out}$ from the audio output end $N_{out}$ or from the output end of the amplifying circuit 600. The signals of the audio output end $N_{out}$ and the output end of the amplifying circuit are analog signals. The control circuit 24 can convert the amplified analog audio signal $S_{out}$ into a digital signal through an analog-to-digital conversion circuit (not shown), and then, the control circuit 24 reads the digital signal.

In some embodiments, the operation of controlling the power supply circuit 22 to supply power to the amplifying circuit 600 at a preset voltage value, detect the amplified analog audio signal $S_{out}$, adjust the offset compensation circuit 100, record the coordinates of the voltage signal X and the DC offset compensation value Y as well as calculate the slope parameter M and the constant C can be performed by external devices and/or by manual cooperation, but is not limited thereto.

After the control circuit 24 activates the audio device 10, the duration of the preset time is related to the starting time of the internal components of the audio device 10, and the preset time is longer than the time required for starting the internal components.

According to the above description, in the embodiment of FIG. 4, M obtained by the control circuit 24 is approximately 0.298, and C obtained by the control circuit 24 is approximately 3.081. Therefore, during operation of the audio device 10, the voltage detecting circuit 200 detects a supply voltage which the amplifying circuit 600 is supplied with and outputs a voltage signal (such as 7V). The offset compensation circuit 100 obtains and outputs a corresponding DC offset compensation value Y according to the linear equation and the voltage signal (such as 7V). According to the slope parameter M and the constant C of FIG. 4, the DC offset compensation value output by the offset compensation circuit 100 is 5.167. Therefore, when the digital audio signal $S_{in}$ is input, the digital audio signal $S_{in}$ is added to the DC offset compensation value by the adder 400 to output the added signal $S_{add}$. The added signal $S_{add}$ is converted into a converted analog audio signal $S_{ca}$ by the digital-to-analog conversion circuit 500. After the converted analog audio signal $S_{ca}$ is amplified by the amplifying circuit 600, the audio output end $N_{out}$ of the audio device 10 outputs the amplified analog audio signal $S_{out}$, and thus, the DC offset compensation value of the amplified analog audio signal $S_{out}$ is appropriately compensated.

Figure 3:
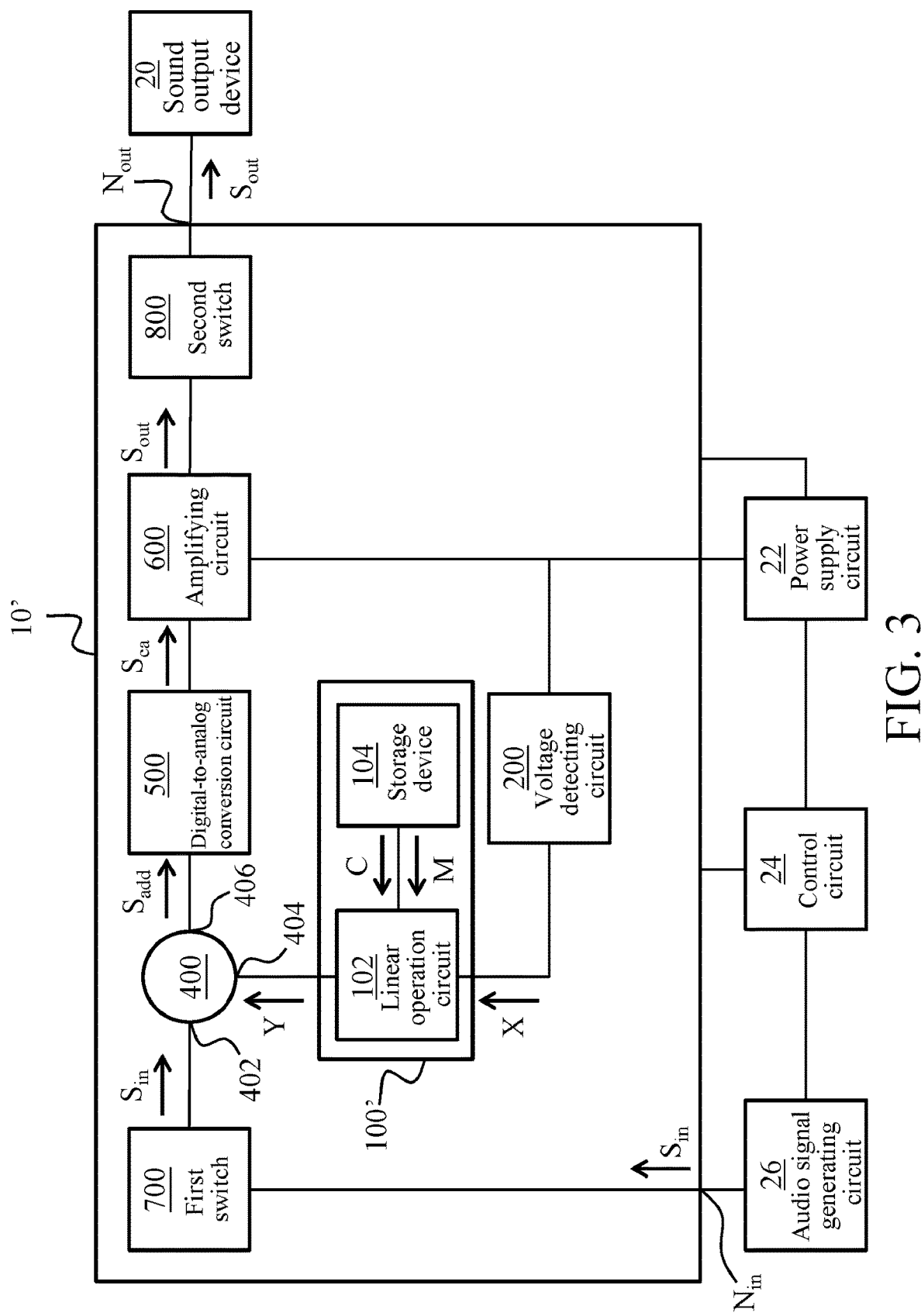
FIG. 3 illustrates a block diagram of an audio device according to some embodiments of the present invention.

Referring to FIG. 3, FIG. 3 illustrates a block diagram of an audio device according to some embodiments of the present invention. An audio device 10' includes an adder 400, a digital-to-analog conversion circuit 500, an amplifying circuit 600, a voltage detecting circuit 200 and an offset compensation circuit 100'. The offset compensation circuit 100' includes a linear operation circuit 102 and a storage device 104. The storage device 104 stores the slope parameter M and the constant C. The linear operation circuit 102 reads the slope parameter M and the constant C. During implementation, the slope parameter M and the constant C are fixed values and are pre-stored in the storage device 104. The linear operation circuit 102 obtains a DC offset compensation value according to the linear equation, the voltage signal X, the slope parameter M and the constant C, and outputs the DC offset compensation value to the adder 400. The storage device 104 is, but not limited to, an electrically-erasable programmable read-only memory (EEPROM), a flash or a hard disk drive. According to some embodiments, the input signal is for example, but not limited to, an audio signal, noise or a combination of the audio signal and the noise.

In some embodiments, the offset compensation circuit 100 as shown in FIG. 2 obtains the DC offset compensation value by means of a lookup table. Specifically, the lookup table is constructed by obtaining a plurality of coordinate points in a method similar to the above-mentioned method of obtaining the coordinates of the voltage signal and the DC offset compensation value. Therefore, the offset compensation circuit 100 searches for the closest DC offset compensation value Y in the lookup table according to the voltage signal X and then outputs the DC offset compensation value Y to the adder 400. In some embodiments, the offset compensation circuit 100 obtains the DC offset compensation value by means of an interpolation method. Specifically, the offset compensation circuit 100 internally stores DC bias values corresponding to the highest possible voltage signal and the lowest possible voltage signal (hereinafter referred to as two end points). The offset compensation circuit 100 can obtain the DC offset compensation value corresponding to the voltage signal by an interpolation method according to the voltage signal from the voltage detecting circuit 200 and the two end points. In some embodiments, the offset compensation circuit 100 can obtain the DC offset compensation value by means of an extrapolation method or a lookup table.

Furthermore, in some embodiments, simultaneously referring to FIG. 2 and FIG. 3, an audio device 10 or 10' further includes a first switch 700 and a second switch 800. The first switch 700 is connected between the audio input end $N_{in}$ and the first input terminal 402. The second switch 800 is connected between the output of the amplifying circuit 600 and the audio output end $N_{out}$. When the first switch 700 is activated, the first switch 700 connects the digital audio signal $S_{in}$ with the first input terminal 402. When the second switch 800 is activated, the second switch 800 connects the output of the amplifying circuit 600 with the audio output end $N_{out}$. Therefore, when the first switch 700 is activated, the first switch 700 conducts the audio generating circuit 26 and the first input terminal 402 and the digital audio signal $S_{in}$ is input to the first input terminal 402. Similarly, when the second switch 800 is activated, the second switch 800 conducts the output of the amplifying circuit 600 to the audio output end $N_{out}$ and the amplified analog audio signal $S_{out}$ from the amplifying circuit 600 is output to the audio output end $N_{out}$.

Based on the above, the first switch 700 and the second switch 800 are in an off state (not activated or not turned on) when the audio device 10 or 10' is not activated (powered). The control circuit 24 is configured to activate the power supply circuit 22 to supply the power to the audio device 10 or 10' when the audio output end $N_{out}$ is connected to an audio connector (a plug). At this time, the control circuit 24 controls the first switch 700 and the second switch 800 to be kept in an off state. After the audio output end $N_{out}$ is connected to the audio connector for a predetermined time, the control circuit 24 activates the first switch 700 to connect the digital audio signal $S_{in}$ to the first input terminal 402, and activates the second switch 800 to output the amplified analog audio signal $S_{out}$ through the audio output end $N_{out}$. The predetermined time may be greater than or equal to the time required for completion of the DC offset compensation operation by the audio device 10 or 10'. Therefore, when a user inserts the audio connector of the sound output device 20 into the audio output end $N_{out}$, the control circuit 24 starts the audio device 10 or 10'. After the audio device 10 or 10' completes the DC offset compensation, the control circuit 24 connects the audio input end $N_{in}$ (that is, the output of the audio generating circuit 26) to the adder 400 and connects the output of the amplifying circuit 600 to the audio output end $N_{out}$. At this time, the control circuit 24 can control the audio generating circuit 26 to output the digital audio signal $S_{in}$, so that the output amplified analog audio signal $S_{out}$ does not have the pop noise generated by the DC offset.

Figure 5:
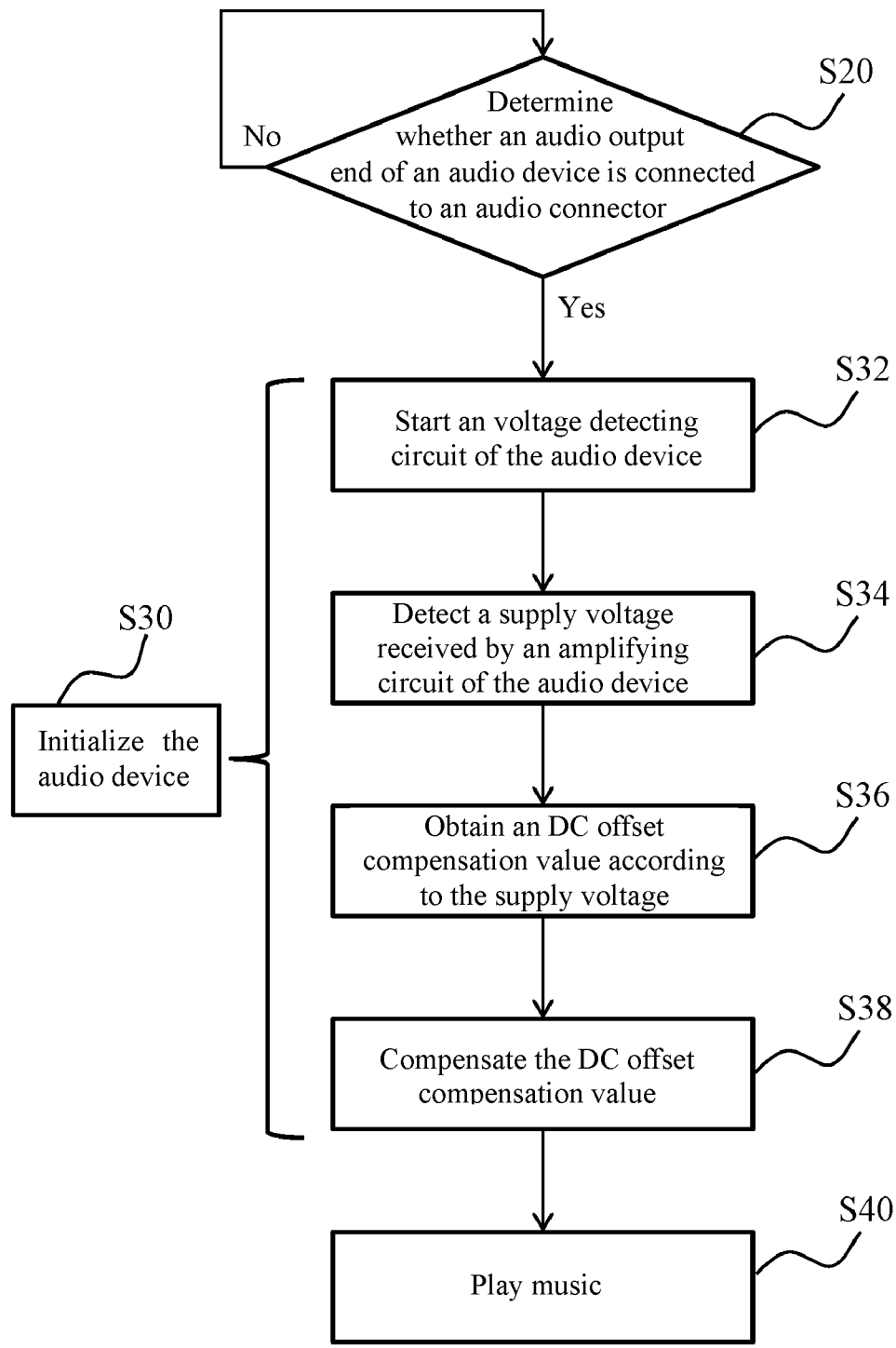
FIG. 5 illustrates a flow chart of an audio signal processing method according to some embodiments of the present invention.

Referring to FIG. 5, FIG. 5 illustrates a flow chart of an audio signal processing method according to some embodiments of the present invention. According to some embodiments, the audio signal processing method includes:

Step S20: determining whether an audio output end $N_{out}$ of an audio device 10, 10' is connected to an audio connector;

Step S30: when the audio output end $N_{out}$ is connected to the audio connector, initializing the audio device 10 or 10; and Step S40: playing music.

The operation of determining whether the audio output end $N_{out}$ is connected to the audio connector in step S20 is performed by the control circuit 24. When the audio connector is connected to the audio output end $N_{out}$, the control circuit 24 activates the power supply circuit 22 to supply power to the audio device 10 or 10', the audio device 10 or 10' is initialized (step S30). The operation of the initialization is detailed later.

After the audio device 10 or 10' is initialized, the control circuit 24 waits for a music playing command sent by a user. The control circuit 24 activates the audio generating circuit 26 when receiving the music playing command to play music (step S40). In some embodiments, the control circuit 24 activates (turns on) the first switch 700 and the second switch 800 when the initialization of the audio device 10 or 10' is completed, so that the audio device 10 or 10' is in a "Ready" state.

The time during which the control circuit 24 determines whether the audio connector is connected to the audio output end $N_{out}$ and then activates the first switch 700 and the second switch 800 may be, but not limited to, a default value. That is, in implementation, the time of initialization of the audio device 10 or 10' can be estimated or measured at a design stage or in an actual operation test. Therefore, the control circuit 24 activates the first switch 700 and the second switch 800 according to an empirical value or a design value.

In some embodiments, the step S20 keeps detecting whether the audio output end $N_{out}$ is connected to the audio connector until the audio output end $N_{out}$ is connected to the audio connector.

The initialization of the audio device 10 or 10' of the step S30 includes:

Step S32: starting an voltage detecting circuit 200 of the audio device 10, 10';

Step S34: detecting a supply voltage received by an amplifying circuit 600 of the audio device 10, 10';

Step S36: obtaining a DC offset compensation value according to the supply voltage; and Step S38: compensating the DC offset compensation value.

After the power supply circuit 22 supplies the power to the audio device 10, 10', the internal components of the audio device 10, 10' are supplied with power and are separately started or initialized (step S32: starting the voltage detecting circuit 200).

Subsequently, the voltage detecting circuit 200 detects a supply voltage received by the amplifying circuit 600 (that is, the voltage of power which the amplifying circuit 600 is supplied with), and outputs the voltage signal X (step S34). The offset compensation circuit 100, 100' obtains and outputs the DC offset compensation value Y according to the voltage signal X. As described above, the adder 400 compensates the signal of the first input terminal 402 according to the DC offset compensation value (step S38) and then outputs the added signal $S_{add}$. The digital-to-analog conversion circuit 500 converts the added signal $S_{add}$ into a converted analog audio signal $S_{ca}$. The amplifying circuit 600 amplifies the converted analog audio signal $S_{ca}$, and then, outputs the amplified analog audio signal $S_{out}$. Therefore, the DC offset of the audio device 10, 10' is compensated before the music is played (step S40) without generating the pop noise.

Based on the above, according to some embodiments, the audio device 10, 10' and the audio signal processing method can appropriately compensate the DC bias of the audio device 10, 10' according to the change of the supply voltage received by the amplifying circuit 600, thereby preventing the audio device 10, 10' from generating the pop noise.

What is claimed is:

1. An audio device comprising:
   an adder including a first input terminal, a second input terminal, and an output terminal and configured to add signals of the first input terminal and the second input terminal to output an added signal through the output terminal, the first input terminal being configured to receive a digital audio signal;
   a digital-to-analog conversion circuit configured to perform digital-to-analog conversion on the added signal to generate a converted analog audio signal;

an amplifying circuit configured to amplify the converted analog audio signal to generate an amplified analog audio signal;

a voltage detecting circuit configured to detect a supply voltage received by the amplifying circuit and output a voltage signal related to the supply voltage; and an offset compensation circuit configured to obtain a direct current (DC) offset compensation value according to the voltage signal and output the DC offset compensation value to the second input terminal.

2. The audio device according to claim 1, further comprising a first switch and a second switch, wherein when the first switch is activated, the first switch connects the digital audio signal to the first input terminal, and when the second switch is activated, the amplified analog audio signal is output.

3. The audio device according to claim 1, wherein the adder is a digital adder circuit.

4. The audio device according to claim 1, wherein the offset compensation circuit comprises a linear operation circuit that obtains the DC offset compensation value according to a linear equation that includes a slope parameter, the voltage signal, and a constant, wherein the linear equation is:

$$Y=M*X+C$$

wherein Y is the DC offset compensation value, X is the voltage signal, M is the slope parameter, and C is the constant.

5. The audio device according to claim 4, further comprising a first switch and a second switch, wherein when the first switch is activated, the first switch connects the digital audio signal to the first input terminal, and when the second switch is activated, the amplified analog audio signal is output.

6. The audio device according to claim 4, wherein the offset compensation circuit further comprises a storage device configured to store the slope parameter and the constant and output the slope parameter and the constant to the linear operation circuit.

7. The audio device according to claim 6, further comprising a first switch and a second switch, wherein when the first switch is activated, the first switch connects the digital audio signal to the first input terminal, and when the second switch is activated, the amplified analog audio signal is output.

8. An electronic device, comprising:
an audio generating circuit configured to generate a digital audio signal;
a power supply circuit configured to generate power;
an audio device comprising:
  an audio output end;
  an adder including a first input terminal, a second input terminal and an output terminal, wherein the adder is configured to add signals of the first input terminal and the second input terminal to output an added signal through the output terminal, and the first input terminal is configured to receive a digital audio signal;
  a digital-to-analog conversion circuit configured to perform digital-to-analog conversion on the added signal to generate a converted analog audio signal;
  an amplifying circuit configured to amplify the converted analog audio signal to generate an amplified analog audio signal;
  a voltage detecting circuit configured to detect a supply power received by the amplifying circuit and output a voltage signal related to the supply voltage; and
  an offset compensation circuit configured to obtain a direct current (DC) offset compensation value according to the voltage signal and output the DC offset compensation value to the second input terminal; and
a control circuit configured to activate the power supply circuit to supply the generated power to the audio device when the audio input end is connected to an audio connector.

9. The electronic device according to claim 8, wherein the offset compensation circuit comprises a linear operation circuit that obtains the DC offset compensation value according to a linear equation, the voltage signal, a slope parameter and a constant, wherein the linear equation is:

$$Y=M*X+C,$$

wherein Y is the DC offset compensation value, X is the voltage signal, M is the slope parameter, and C is the constant.

10. The electronic device according to claim 8, wherein the audio device further comprises a first switch and a second switch, and after the audio input end is connected to the audio connector for a predetermined time, the control circuit activates the first switch to connect the digital audio signal to the first input terminal, and activates the second switch to output the amplified analog audio signal through the audio output end.

11. The electronic device according to claim 10, wherein the offset compensation circuit comprises a linear operation circuit, and the linear operation circuit obtains the DC offset compensation value according to a linear equation, the voltage signal, a slope parameter and a constant, wherein the linear equation is:

$$Y=M*X+C$$

wherein Y is the DC offset compensation value, X is the voltage signal, M is the slope parameter, and C is the constant.

12. The electronic device according to claim 11, wherein the offset compensation circuit further comprises a storage device configured to store the slope parameter and the constant and output the slope parameter and the constant to the linear operation circuit.

13. An audio signal processing method, comprising:
starting a voltage detecting circuit;
detecting a supply voltage which an amplifying circuit is supplied with;
obtaining a DC offset compensation value according to the supply voltage; and
compensating the DC offset compensation value.

14. The audio signal processing method according to claim 13, wherein before the starting step, the audio signal processing method further comprises:
determining whether an audio output end is connected to an audio connector until the audio output end is connected to the audio connector.

* * * * *